United States Patent [19]

Reavill

[11] 4,282,077
[45] Aug. 4, 1981

[54] UNIFORM PLASMA ETCHING SYSTEM

[75] Inventor: Joseph A. Reavill, Mira Loma, Calif.

[73] Assignee: General Dynamics, Pomona Division, Pomona, Calif.

[21] Appl. No.: 165,821

[22] Filed: Jul. 3, 1980

[51] Int. Cl.³ .................. C23F 1/00; H01L 21/306
[52] U.S. Cl. .......................... 204/192 E; 156/345; 156/643; 204/298
[58] Field of Search .............. 204/192 E, 298; 156/643, 345, 646; 118/715, 719; 250/531

[56] References Cited

U.S. PATENT DOCUMENTS

| | | | |
|---|---|---|---|
| 3,615,956 | 10/1971 | Irving | 156/17 |
| 3,879,597 | 4/1975 | Bersin et al. | 204/192 E |
| 4,012,307 | 3/1977 | Phillips | 204/192 E |
| 4,178,877 | 12/1979 | Kudo | 118/728 |

FOREIGN PATENT DOCUMENTS 1522059 8/1978 United Kingdom .................. 204/298

OTHER PUBLICATIONS

J. L. Vossen et al., *Thin Film Processes,* Academic Press, New York, 1978, pp. 531-533.

*Primary Examiner*—Delbert E. Gantz
*Assistant Examiner*—William Leader
*Attorney, Agent, or Firm*—Neil F. Martin; Freling E. Baker; Edward B. Johnson

[57] ABSTRACT

A uniform plasma etching system includes a plasma reaction chamber with a source of reactive gas communicating therewith and an RF generator connected to individual electrodes located in the plasma chamber, the electrodes arranged for defining separate part cells and separate plasma generating chambers between the separate cells and means for individually and separately adjusting each of the cells.

9 Claims, 3 Drawing Figures

UNIFORM PLASMA ETCHING SYSTEM

BACKGROUND OF THE INVENTION

The present invention relates to the field of gas plasma treating and pertains particularly to a system and method of uniform plasma treatment of articles.

Gas plasma etching has been found to be quite useful for many applications in the electronics and micro-circuit industry. Among the uses are such as that disclosed in U.S. Pat. No. 4,012,307 issued Mar. 15, 1977 to Eugene Phillips and assigned to the assignee hereof. In that patent there is disclosed a method of plasma etching of certain multi-layered printed circuit or wiring boards to remove smears of thin layers or coatings of plastic within drilled holes in the circuit board. The coatings of plastic and adhesive around the apertures in such boards can prevent the achievement of good contact between layers within the board during the plating or formation of contacts within the board. Plasma etching has been found to be an effective technique for the removal of these interfering layers and small fragments of plastic or the like that may remain in the apertures to interfere with effective contact.

The above identified U.S. Pat. No. 4,012,307 discloses a method of plasma etching as discussed above and the contents of said patents are fully incorporated herein by reference as though fully set forth.

Among the utility described in the aforementioned patent is that of cleaning smears and fragments of adhesive and plastic from drilled holes within multi-layered circuit boards. Although the aforementioned method is effective for this purpose it has been during use thereof that certain drawbacks do exist. For example, it has been discovered that the placement of multiple parts within an etching chamber can result in some parts being etched at a different rate from other parts. Such etching can be dependent upon the arrangement of the part within the etching chamber and its relationship or position therein relative to other similar parts. This non-uniform etching of the parts can result in over etching of certain portions of certain parts and under etching of others.

For the above reasons, it is desirable that a method and system be available which is capable of providing uniform etching of parts within a gas plasma system.

SUMMARY AND OBJECTS OF THE INVENTION

It is therefore the primary object of the present invention to provide an improved method and system for gas plasma etching.

In accordance with the primary aspect of the present invention a plasma etching system includes a gas plasma chamber with means defining a plurality of individual part cells, each cell having means for specifically and independently adjusting the etching rate of the cell, and each cell separated from each adjacent cell by means of a plasma cell. The method of the invention includes selecting a plasma gas chamber and arranging a plurality of electrodes within the chamber for defining individual separate part cells separated by plasma cells and disposing a part within the respective cells and adjusting the optimum etch rate of the respective cells individually.

BRIEF DESCRIPTION OF THE DRAWINGS

The above and other objects and advantages of the invention will become apparent from the following description when read in conjunction with the drawings wherein.

DETAILED DESCRIPTION OF A PREFERRED EMBODIMENT

Figure 1:
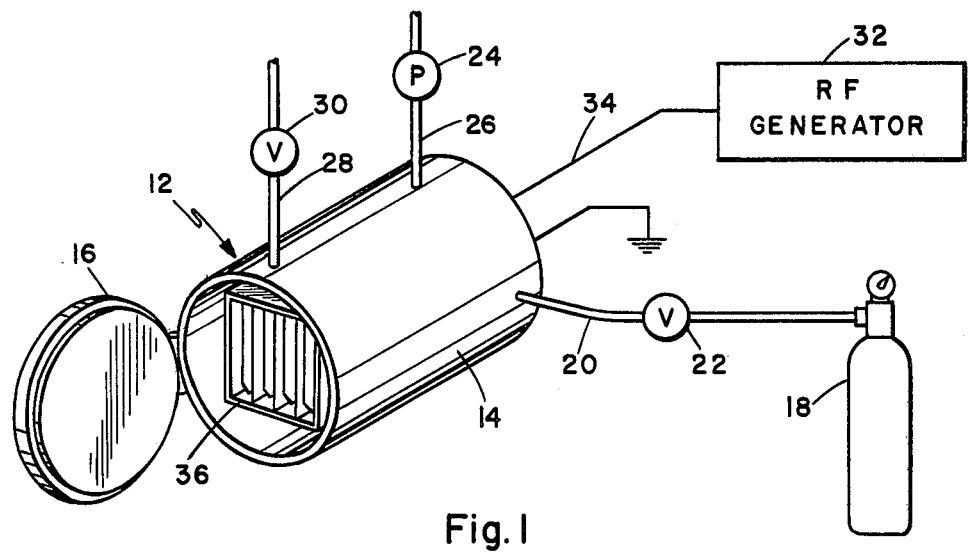
FIG. 1 is a schematic illustration of a system in accordance with the invention.

Turning now to FIG. 1 of the drawings there is illustrated a gas plasma etching system in accordance with the invention designated generally by the numeral 12 and generally comprising a gas plasma generating chamber 14 defined by a housing defining a generally cylindrical interior chamber closable by means of a door or lid 16. A source of gas 18 is connected by conduit means 20 for supplying gas at a controlled and predetermined pressure to the chamber 14. A valve 22 controls the supply of plasma forming gas into the reactor chamber.

Any number of suitable gases or mixtures thereof may be selected to be supplied to the chamber depending upon the articles to be treated or etched and other considerations. Gases such as oxygen, mixtures of oxygen and carbon tetrafloride and other plasma producing gases may be supplied to the chamber. The pressure within the chamber is controlled, for example, by means of a vacuum pump or the like 24 which is connected by suitable conduit 26 for drawing a vacuum and establishing the necessary pressure or vacuum within the chamber. Atmospheric air may be admitted into the chamber by means of suitable venting arrangement including a conduit 28 or atmospheric air supply line 28 controlled by valve 30.

Figure 2:
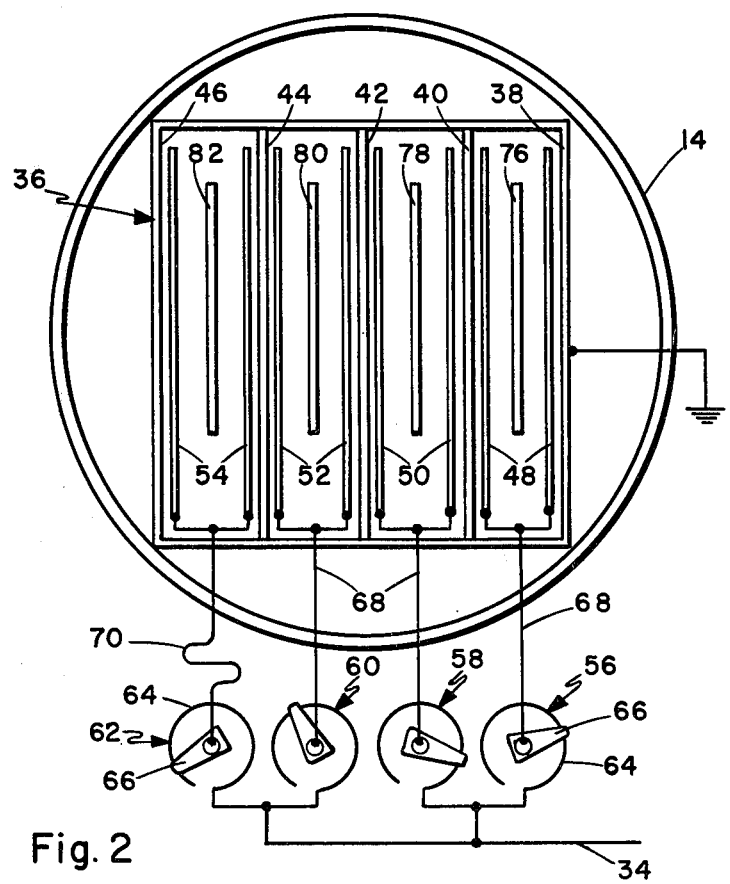
FIG. 2 is a schematic end elevation view of the arrangement of the cells and the electrical connections.

An RF generator 32 is connected by suitable conductors to electrodes within the chamber as best illustrated schematically for example in FIG. 2. The interior of the chamber defined by housing 14 is provided with an arrangement of electrodes as shown wherein a frame 36 mounted within the chamber includes a plurality of negative or ground electrodes 38, 40, 42, 44, 46 respectively mounted directly thereon and secured thereto. Also mounted within the frame 36 and isolated therefrom by suitable insulating means are pairs of parallel opposed planar hot electrodes 48, 50, 52 and 54. These electrodes are disposed in opposed pairs within and between pairs of the ground electrodes and define a plurality of part cells therein. A part cell is defined between each of the pairs of opposed positive electrodes 48, 50, 52, and 54 and separated by plasma cells as will be described. These individual part electrodes are connected by means of an adjustable electrical circuit each having an individual and separate adjustable induction control element 56, 58, 60 and 62 respectively.

These arrangements provide a plurality of individual and separate part cells defined by the sets or pairs of parallel like polarity electrodes 48, 50, 52 and 54 each of which extends parallel and adjacent to an electrode 38, 40, 42, 44 and 46 of opposite polarity to thereby provide or define a plasma generating cell at each side of each of the part cells and separating the respective part cells from each adjacent part cell. Each of these electrodes in the illustrated embodiment preferably comprise a flat perforated sheet of suitable electrode material such as aluminum for example. The perforations permit free flow of the plasma into contact with the part in the part cell. With this arrangement plasma is generated within plasma cells outside of the part cells to opposite sides thereof. This results in lower temperature within the part cell. The plasma can circulate through the electrodes into contact with the parts within the part cell for accomplishing appropriate etching.

Each of the individual part cells can be individually and independently adjusted by means of the induction adjusting device 56 through 62. This arrangement has been found to provide uniform etching of the parts within the reaction chamber. Although the illustrated embodiment provides parallel planar electrodes defining a generally planar chamber for receiving a part of a planar configuration it is apparent that the part cells can have other shapes such as be shaped so that the electrodes conform to opposed surfaces of a part to be etched. The generation of the plasma outside of the part cells is effective to keep a lower temperature within the part cell.

Figure 3:
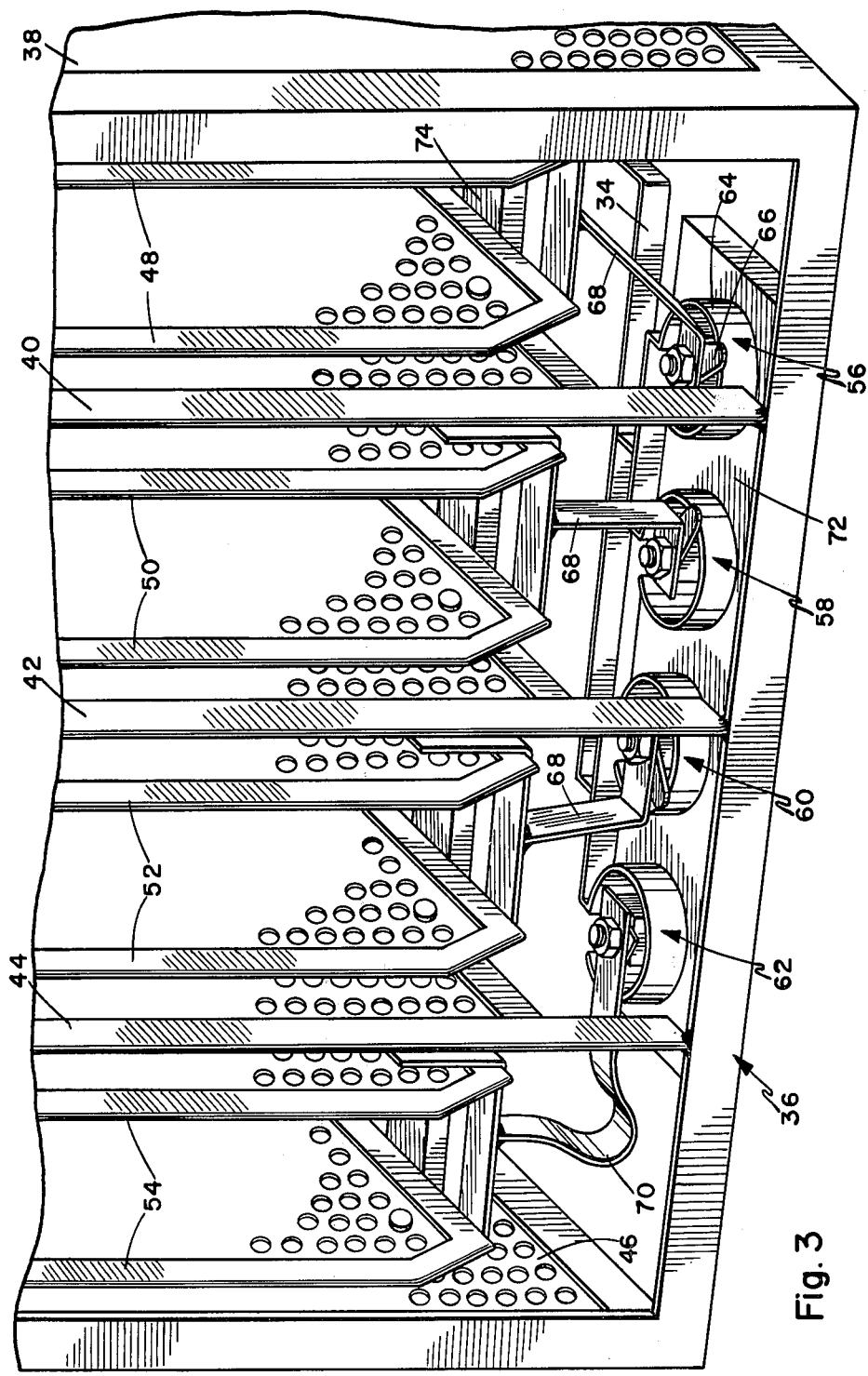
FIG. 3 is a perspective view showing the electrode structure and connection arrangement.

As best seen in FIGS. 2 and 3 the electrodes of each cell are connected together by a common conductor that connects to the respective variable impedance devices. Each of the variable inductances comprises an inductance coil 64 connected directly to the input line 34 (i.e. power source) and a variable or moveable conductor element 66 positioned to be adjusted around the length of the coil 64 for varying the inductance with the line between the inlet line and the conductor element 68 to the pairs of electrodes. The inductance coils are all mounted within an insulating block 72. The electrodes 48-54 are also similarly mounted or supported on an insulation member 74.

With this arrangement each individual cell can be selectively adjusted independently of the other cells within the system. This balanced parallel electrode system provides for effective and efficient individual etching of multiple parts within a single reaction chamber. The system uniformly etches each side of each part and uniformly etches all parts. In other words the system is able to etch all parts substantially identically.

The inductance of each of the cells can be further altered such as in the case of the inductance member 62 by providing an additional discrete inductor 70 from the variable conductor element 66 engaging the coil 64 to the electrodes.

In operation, individual parts to be etched 76, 78, 80 and 82 are placed in individual or separate part cells to be etched. These parts are not required to be identical but may be different. The reaction chamber is closed, an appropriate reaction gas is fed into the chamber and an appropriate pressure (vacuum) is established therein. The RF generator is operated for a predetermined duration of time to obtain the desired amount or degree of etch. The individual cells may be adjusted when necessary to obtain the optimum etch rate. Ideally for batch processing of identical parts the etch rate will be the same for all cells. Where the parts are different, the cells may be adjusted to the part.

The system and method of the invention was devised primarily for multiple layer (laminated) circuit boards. However, other items that can be effectively treated by plasma etching can be treated by the disclosed system and process. Changes may be made in the system and the method to adapt them to the particular items to be treated without departing from the invention.

The method and/or process of the invention includes the steps of selecting a plasma gas etching system having a gas plasma chamber, selecting and arranging a plurality of electrodes within the chamber for defining a plurality of individual and separate part chamber and a plurality of separate plasma chambers intermediate the part chambers within the gas chamber, selectively connecting the electrodes of each each of the part chambers for independent individual adjustment to an RF generator, and introducing a gas and RF signal into the chamber for generating plasma within the chamber. The step of arranging the electrodes within the chamber includes arranging said electrodes to provide separate plasma cells outside the part cells disposed between and separating each part cell from an adjacent part cell. The method includes the introduction of an appropriate etching plasma forming gas and operation of the RF generator for an appropriate period of time while establishing an appropriate pressure within the chamber and adjusting each of the respective part cells for optimum etching thereof.

While I have illustrated and described my invention by means of specific embodiments, it is to be understood that numerous changes and modifications may be made therein by those skilled in the art without departing from the spirit and scope of the invention as defined in the appended claims.

I now claim:

1. A uniform plasma etching system comprising in combination:
   a chamber;
   a source of reactive gas for supplying to said chamber;
   an RF generator coupled to said chamber for generating a plasma therein; and
   a plurality of part cells within said chamber formed by pairs of generally opposed electrodes of the same polarity and plasma cells at each side of said part cells, each of said part cells being separated from each adjacent part cell by a plasma cell, each of said plasma cells being defined by adjacent generally opposed electrodes of opposite polarity positioned to generate plasma externally of the adjacent part cell.

2. The plasma generating system of claim 1 wherein said electrodes of like polarity are generally planar in configuration and are disposed in pairs in parallel planes.

3. The plasma etching system of claim 1 wherein:
   each of said part cells is defined by a pair of generally planar parallel electrodes of the same polarity; and
   adjustable inductance means connecting said pair of electrodes to said RF generator.

4. The plasma etching system of claim 3 wherein each plasma cell is defined by a ground electrode adjacent one of said pair of electrodes.

5. The plasma etching system of claim 4 wherein:
   said pair of electrodes and said ground electrodes are each formed of a perforated sheet of metal.

6. The plasma etching system of claim 5 including a support frame disposed in said chamber;
   said ground electrodes are secured directly to said frame; and
   said pairs of electrodes are mounted on insulating means on said frame.

7. A method of uniform plasma etching of parts comprising the steps of:
- selecting a plasma reaction chamber having a source of gas and means for selectively adjusting the gas pressure in said chamber;
- selecting and arranging a plurality of pairs of generally opposed electrodes of like polarity for defining a plurality of individual part cells within said chamber separated by plasma generating cells, each formed by a pair of generally opposed electrodes of opposite polarity; and
- placing a separate part in separate ones of said individual part cells.

8. The method of claim 7 including the steps of: selectively adjusting the etch rate of each part cell.

9. The method of claim 8 wherein the step of adjusting the etch rate is carried out by adjusting the impedance of the cell.

* * * * *